(12) United States Patent
Lin et al.

(10) Patent No.: US 11,016,541 B2
(45) Date of Patent: May 25, 2021

(54) HINGE ASSEMBLY AND ELECTRONIC DEVICE USING THE SAME

(71) Applicants: Che-Hsien Lin, Taipei (TW); Ko-Yen Lu, Taipei (TW)

(72) Inventors: Che-Hsien Lin, Taipei (TW); Ko-Yen Lu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/699,079

(22) Filed: Nov. 28, 2019

(65) Prior Publication Data

US 2020/0174531 A1 Jun. 4, 2020

Related U.S. Application Data

(60) Provisional application No. 62/774,876, filed on Dec. 4, 2018.

(51) Int. Cl.
*H05K 5/00* (2006.01)
*G06F 1/16* (2006.01)
(Continued)

(52) U.S. Cl.
CPC ........... *G06F 1/1681* (2013.01); *E05D 3/122* (2013.01); *E05D 11/0054* (2013.01);
(Continued)

(58) Field of Classification Search
None
See application file for complete search history.

(56) References Cited

U.S. PATENT DOCUMENTS 6,519,812 B2 * 2/2003 Ko .................. H04N 5/2251
16/354
8,943,649 B2 * 2/2015 Chen .................. G06F 1/1681
16/320

(Continued)

FOREIGN PATENT DOCUMENTS

CN 108266452 7/2018

OTHER PUBLICATIONS

"Office Action of China Counterpart Application", dated Sep. 29, 2020, p. 1-p. 8.

*Primary Examiner* — Anthony Q Edwards
*Assistant Examiner* — Rashen E Morrison
(74) *Attorney, Agent, or Firm* — JCIPRNET (57) ABSTRACT

A hinge assembly and an electronic device using the hinge assembly are provided. The hinge assembly includes a pair of gear brackets coaxially staggered in an axial direction, wherein each gear bracket has a plate portion and an arc portion, and the arc portion has an inner gear; a shaft holder, which is provided between the arc portion of the gear bracket, wherein the shaft holder has a pair of first fixing holes; a pair of gear shafts, which passes through the first fixing hole and is fixed to the shaft holder in parallel to the axial direction, each of the gear shafts has an outer gear portion, the outer gear portion has an outer gear, and the outer gear and the inner gear of the arc portion are engaged with each other; and a pair of torque elements, which are respectively sleeved on opposite ends of the gear shaft; a plurality of gears, which are sleeved on the ends of the gear shaft in a one-to-one manner, and the gears disposed on the same side of the gear shaft are engaged with each other.

12 Claims, 10 Drawing Sheets

(51) Int. Cl.
*H05K 5/02* (2006.01)
*E05D 3/12* (2006.01)
*F16C 11/04* (2006.01)
*E05D 11/08* (2006.01)
*E05D 11/00* (2006.01)

(52) U.S. Cl.
CPC ............ *E05D 11/082* (2013.01); *F16C 11/04* (2013.01); *H05K 5/0226* (2013.01); *E05D 2011/0072* (2013.01); *E05Y 2201/11* (2013.01); *E05Y 2900/606* (2013.01); *F16C 2380/00* (2013.01)

(56) References Cited

U.S. PATENT DOCUMENTS

| | | | | |
|---|---|---|---|---|
| 9,115,750 | B2 * | 8/2015 | Park | G06F 1/1637 |
| 9,342,101 | B2 * | 5/2016 | Hsu | G06F 1/1679 |
| 9,442,533 | B2 * | 9/2016 | Lee | E05D 3/06 |
| 9,606,578 | B2 * | 3/2017 | Yuan | G06F 1/1681 |
| 9,677,308 | B1 * | 6/2017 | Chen | G06F 1/1681 |
| 9,856,909 | B1 * | 1/2018 | Hsu | E05D 3/122 |
| 10,015,897 | B1 * | 7/2018 | Hong | G09F 9/301 |
| 10,227,808 | B2 * | 3/2019 | Siddiqui | G06F 1/1681 |
| 10,296,044 | B2 * | 5/2019 | Siddiqui | F16C 11/04 |
| 10,365,686 | B2 * | 7/2019 | Tucker | G06F 1/1618 |
| 10,480,227 | B1 * | 11/2019 | Chen | E05D 3/122 |
| 10,558,245 | B2 * | 2/2020 | Morrison | G06F 1/1618 |
| 10,641,318 | B2 * | 5/2020 | Siddiqui | G06F 1/1616 |
| 2008/0109995 | A1 * | 5/2008 | Kuwajima | H04M 1/022 16/354 |
| 2009/0013500 | A1 * | 1/2009 | Ueyama | G06F 1/1616 16/354 |
| 2009/0070961 | A1 * | 3/2009 | Chung | E05D 3/122 16/354 |
| 2009/0144934 | A1 * | 6/2009 | Kitagawa | G06F 1/1616 16/320 |
| 2010/0058557 | A1 * | 3/2010 | Wang | G06F 1/1616 16/320 |
| 2010/0071157 | A1 * | 3/2010 | Wang | G06F 1/1681 16/297 |
| 2011/0157780 | A1 * | 6/2011 | Wang | G06F 1/1681 361/679.01 |
| 2012/0042473 | A1 * | 2/2012 | Wang | G06F 1/1681 16/319 |
| 2012/0096678 | A1 * | 4/2012 | Zhang | G06F 1/1681 16/302 |
| 2012/0192381 | A1 * | 8/2012 | Zhang | G06F 1/1681 16/366 |
| 2013/0077041 | A1 * | 3/2013 | Chih | G02C 5/146 351/116 |
| 2014/0146484 | A1 * | 5/2014 | Chen | G06F 1/1679 361/728 |
| 2014/0211380 | A1 * | 7/2014 | Tsai | G06F 1/1681 361/679.01 |
| 2015/0009614 | A1 * | 1/2015 | Tsai | G06F 1/1616 361/679.27 |
| 2015/0309541 | A1 * | 10/2015 | Horng | E05D 11/0054 16/250 |
| 2016/0097227 | A1 * | 4/2016 | Hsu | F16B 1/00 16/354 |
| 2016/0187937 | A1 * | 6/2016 | Ahee | A45C 13/005 361/679.09 |
| 2017/0235337 | A1 * | 8/2017 | Vic | E05D 11/00 361/679.55 |
| 2017/0275935 | A1 * | 9/2017 | Shang | E05D 3/122 |
| 2019/0166703 | A1 * | 5/2019 | Kim | H05K 5/0226 |

* cited by examiner

HINGE ASSEMBLY AND ELECTRONIC DEVICE USING THE SAME

CROSS REFERENCE TO RELATED APPLICATION

This application claims the priority benefit of U.S. provisional application Ser. No. 62/774,876, filed on Dec. 4, 2018. The entirety of the above-mentioned patent application is hereby incorporated by reference herein and made a part of specification.

BACKGROUND

Field of the Disclosure

The present disclosure relates to an assembly and a device, and more particularly to a hinge assembly and an electronic device using the hinge assembly.

Description of Related Art

It is difficult for openable electronic devices to be completely opened by 180 degrees when being relatively opened due to the restriction of mechanism design and its hinge assembly, or the gap between the casings is difficult to be minimized for appearance integrity when the electronic device is relatively closed.

SUMMARY OF THE DISCLOSURE

The present disclosure provides a hinge assembly with a novel architecture.

The present disclosure provides an electronic device using the above-mentioned hinge assembly.

A hinge assembly of the present disclosure includes a pair of gear brackets which are coaxially staggered from each other in an axial direction, wherein each of the gear brackets has a plate portion and an arc portion, and the arc portion has an inner gear; a shaft holder, which is provided between the arc portion of the gear bracket, wherein the shaft holder has a pair of first fixing holes; a pair of gear shafts, which passes through the first fixing hole and is fixed to the shaft holder in parallel to the axial direction, each of the gear shafts has an outer gear portion, the outer gear portion has an outer gear, and the outer gear and the inner gear of the arc portion are engaged with each other; and a pair of torque elements, which are respectively sleeved on opposite ends of the gear shaft; a plurality of gears, which are sleeved on the ends of the gear shaft in a one-to-one manner, and the gears disposed on the same side of the gear shaft are engaged with each other.

An electronic device of the present disclosure includes a first casing, a second casing, and a hinge assembly connected between the first casing and the second casing. The hinge assembly includes a pair of gear brackets, which are coaxially staggered from each other in an axial direction, wherein each of the gear brackets has a plate portion and an arc portion, and the plate portion is connected to the first casing or the second casing respectively, and the arc portion has an inner gear; a shaft holder, which is provided between the arc portions of the gear brackets, wherein the shaft holder has a pair of first fixing holes; a pair of gear shafts, which passes through the first fixing hole and is fixed to the shaft holder in parallel to the axial direction, each of the gear shafts has an outer gear portion, the outer gear portion has an outer gear, and the outer gear and the inner gear of the arc portion are engaged with each other; a pair of torque elements, which are respectively sleeved on opposite ends of the gear shaft; a plurality of gears, which are sleeved on the ends of the gear shaft in a one-to-one manner, and the gears disposed on the same side of the gear shaft are engaged with each other.

In an embodiment of the present disclosure, the above-mentioned hinge assembly further includes a pair of first fixed brackets sleeved on the gear shaft, and the gear is fixed between the torque element and the first fixed brackets.

In an embodiment of the present disclosure, the above-mentioned hinge assembly further includes a plurality of fixed elements, which are sleeved on the ends of the gear shaft, and are configured to fix the first fixed brackets on the ends of the gear shaft, wherein the fixed elements is an E-ring.

In an embodiment of the present disclosure, the above-mentioned hinge assembly further includes a pair of second fixed brackets, which are sleeved on the gear shaft, and the second fixed brackets are disposed between the gear and the torque element.

In an embodiment of the present disclosure, the hinge assembly further includes a pair of hinge caps, and the gear bracket is disposed between the hinge caps.

Based on the above, the hinge assembly of the novel architecture enables the first casing of the electronic device to be opened by 180 degrees relative to the second casing, and when the first casing of the electronic device is closed to 0 degrees relative to the second casing, it is possible to achieve the visual effect that there is hardly a gap in appearance between the first casing and the second casing.

DESCRIPTION OF EMBODIMENTS

Figure 1:
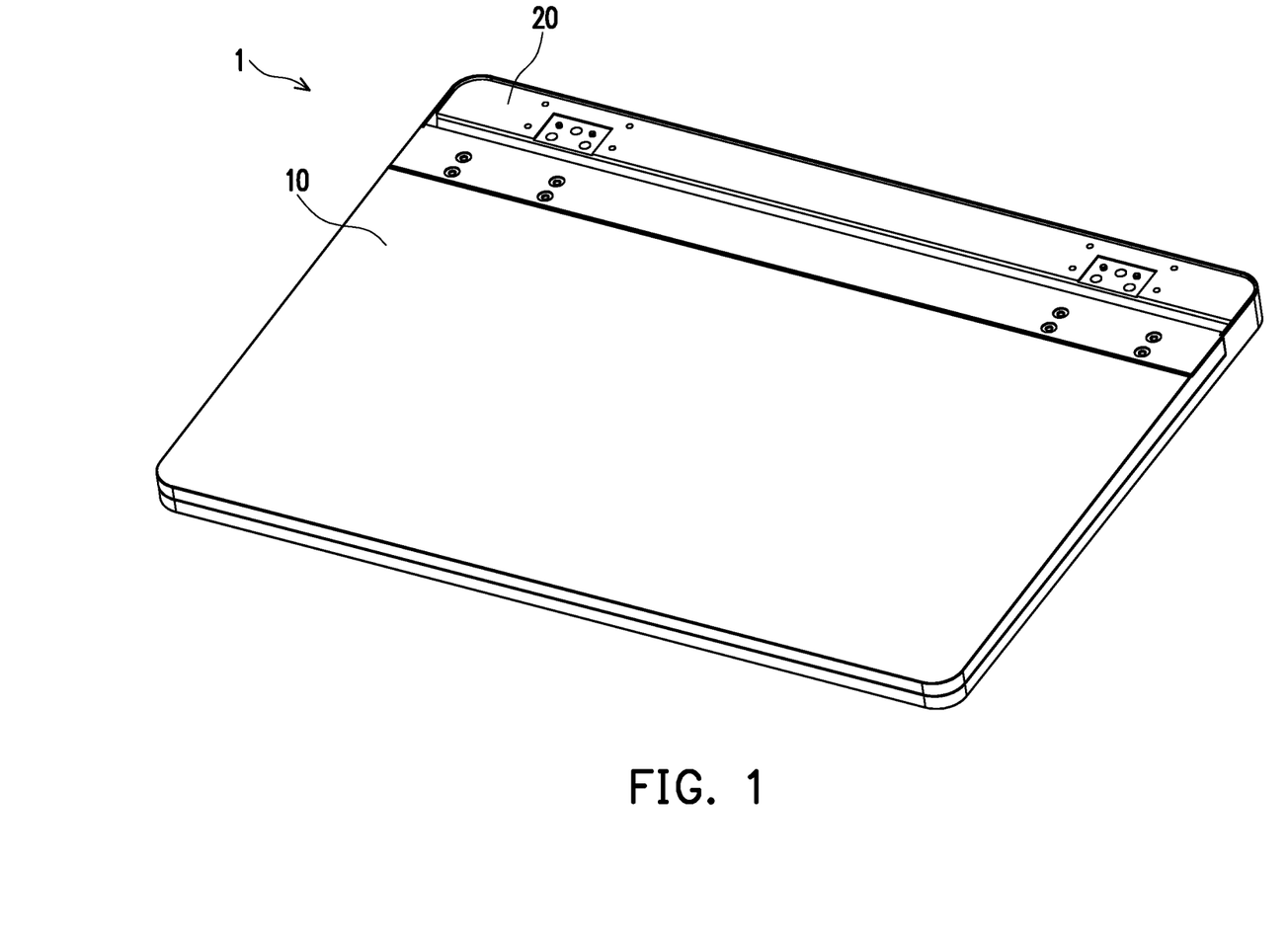
FIG. 1 is a schematic view showing that an electronic device is closed according to an embodiment of the present disclosure.
Figure 2:
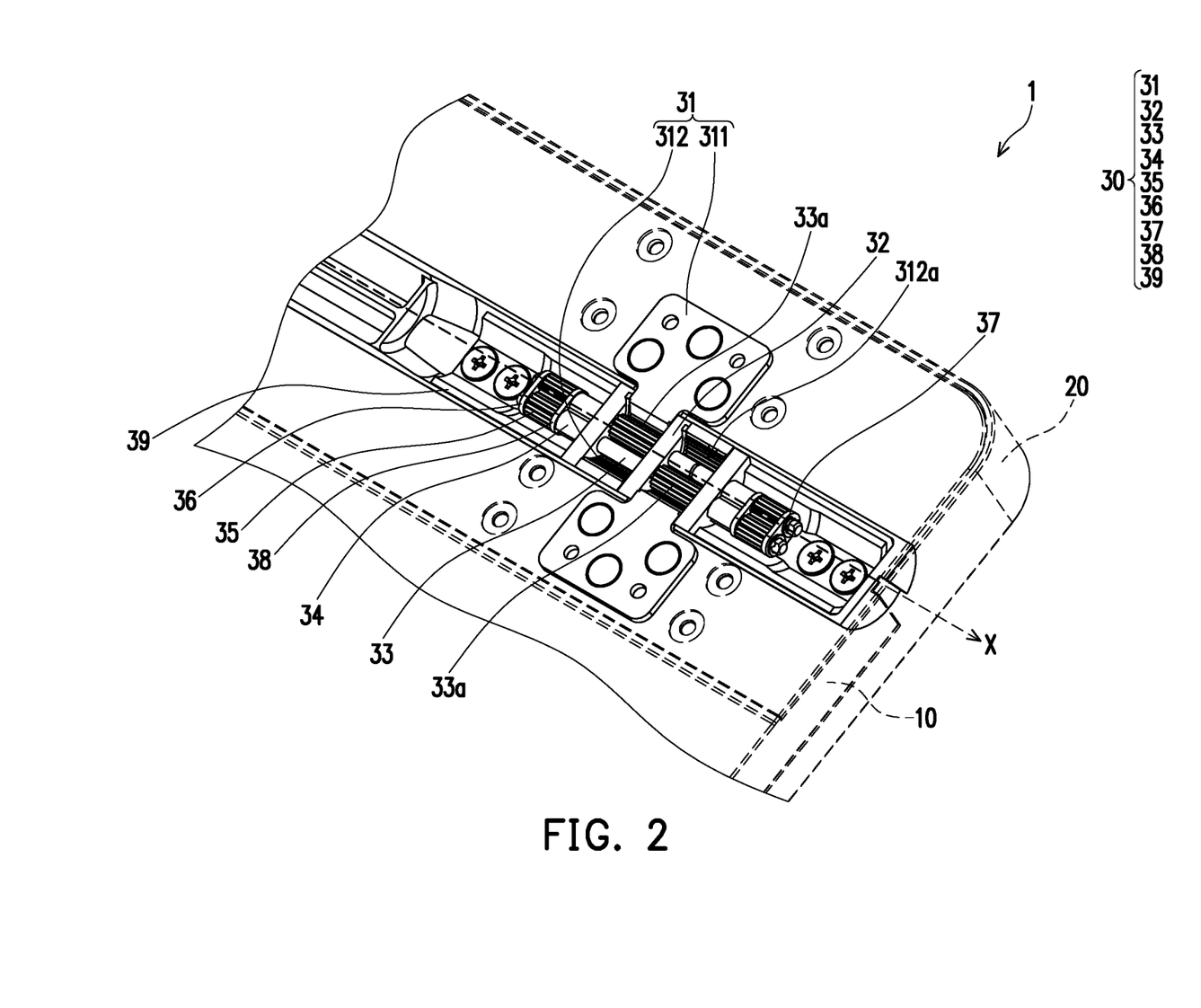
FIG. 2 is a partial schematic view of the electronic device of FIG. 1.
Figure 3:
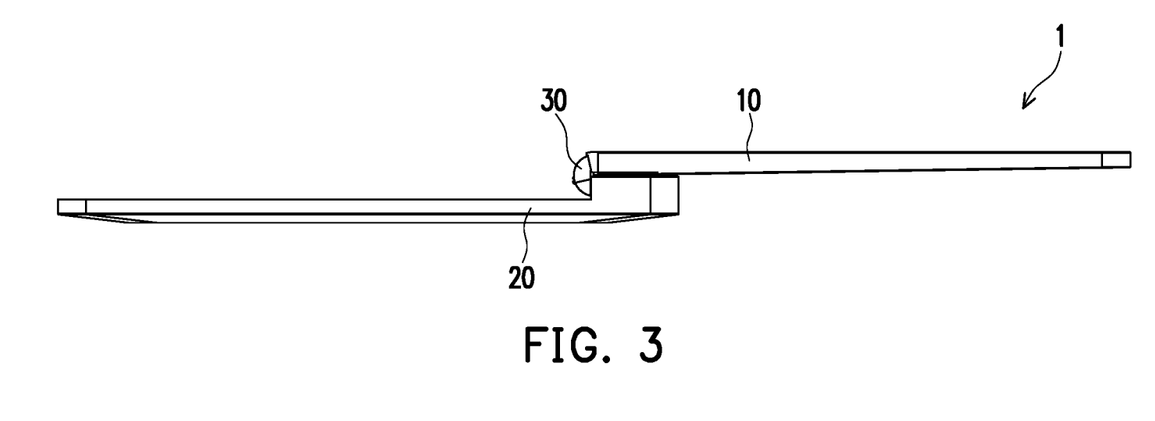
FIG. 3 is a schematic view showing that the electronic device of FIG. 1 is opened.

FIG. 1 is a schematic view showing that an electronic device is closed according to an embodiment of the present disclosure. FIG. 2 is a partial schematic view of the electronic device of FIG. 1. FIG. 3 is a schematic view showing that the electronic device of FIG. 1 is opened. Please refer to FIG. 1, FIG. 2, and FIG. 3 altogether. The electronic device 1 of the present disclosure includes a first casing 10, a second casing 20, and a hinge assembly 30, wherein the first casing 10 is the screen end, the second casing 20 is the system end, and the hinge assembly 30 is connected between the first casing 10 and the second casing 20, such that the first casing 10 can be opened and closed relative to the second casing 20.

Figure 4:
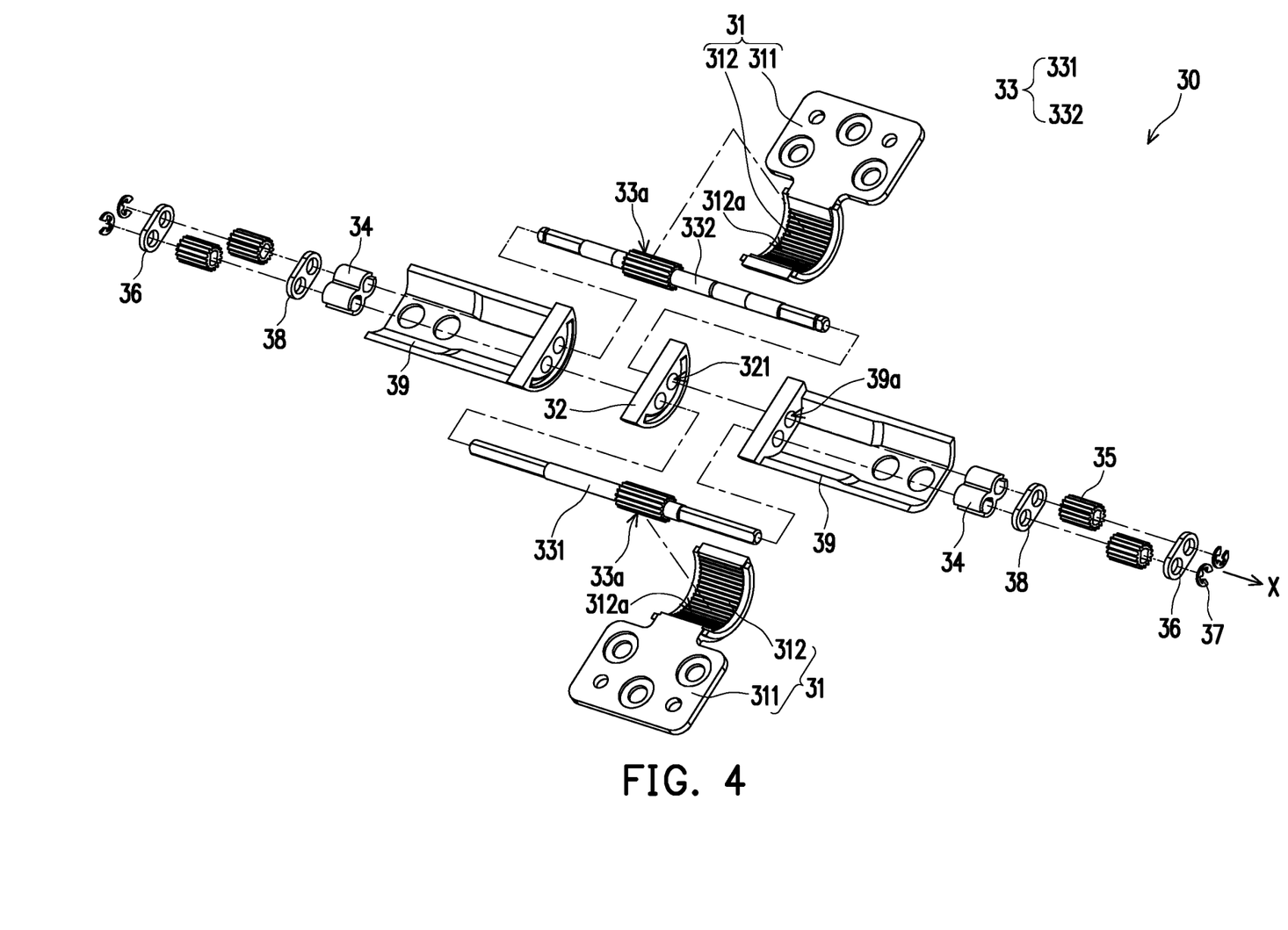
FIG. 4 is an exploded perspective view of the hinge assembly of FIG. 2.

FIG. 4 is an exploded perspective view of the hinge assembly 30 of FIG. 2. Please refer to FIG. 2 and FIG. 4 altogether. The hinge assembly 30 connected between the first casing 10 and the second casing 20 includes a pair of gear brackets 31, a shaft holder 32, a pair of gear shafts 33, a pair of torque elements 34, and a plurality of gears 35.

The gear brackets 31 are coaxially staggered from each other in an axial direction X. Each of the gear brackets 31 has a plate portion 311 and an arc portion 312, wherein the plate portion 311 of one of the gear brackets 31 is connected to the first casing 10, and the plate portion 311 of the other gear bracket 31 is connected to the second casing 20, and the arc portions 312 of the two gear brackets 31 have an inner gear 312a. The coaxial setting referred to here means that the arc portions 312 of the gear brackets 31 have the same center of circle.

Along the axial direction X, the shaft holder 32 is disposed between the arc portions 312 of the gear brackets 31, and the shaft holder 32 has a pair of first fixing holes 321. The shaft holder 32 has a substantially half-moon shape, and its shape corresponds to the shape of the arc portion 312.

A pair of gear shafts 33 passes through the first fixing hole 321 and are fixed to the shaft holder 32 in parallel to the axial direction X. Each of the gear shafts 33 has an outer gear portion 33a, and the outer gear portion 33a has an outer gear, the outer gear is engaged with the inner gear 312a of the arc portion 312. The outer gear portion 33a may be formed by sleeving a gear on the gear shaft 33, or by forming a protruding gear on the outer surface of the gear shaft 33 when forming the gear shaft 33.

The torsion element 34 is exhibited in the form of a sleeve, and the two opposite ends of the gear shaft 33 are respectively sleeved with the torsion element 34.

The gears 35 are sleeved on each end of each gear shaft 33 in a one-to-one manner, and the gears 35 provided on the same side of the gear shaft 33 are engaged with each other.

In addition, the hinge assembly 30 further includes a pair of first fixed brackets 36. The first fixed bracket 36 is sleeved on the gear shaft 33, and the gear 35 is fixed between the torque element 34 and the first fixed bracket 36. The first fixed bracket 36 is configured to fix the position of the gear 35 on the gear shaft 33 to prevent the gear 35 from falling off the gear shaft 33.

In order to fix the first fixed bracket 36 to the gear shaft 33 more stably, the hinge assembly 30 may further include a plurality of fixed elements 37, and the fixed elements 37 may be E-rings, and the E-rings are sleeved on the end of gear shaft 33.

The hinge assembly 30 further includes a pair of second fixed brackets 38, which are sleeved on the gear shaft 33 and disposed between the gear 35 and the torque element 34.

Briefly, along the axial direction X, the torque element 34, the second fixed bracket 38, the gear 35, the first fixed bracket 36, and the fixed element 37 are disposed in sequence from the middle portion to the end of the gear shaft 33.

The above-mentioned hinge assembly 30 further includes a pair of hinge caps 39, and the gear bracket 31 is disposed between the hinge caps 39. The hinge cap 39 has a hollow semi-circular shape. Each of the hinge caps 39 has a pair of second fixing holes 39a aligned with the first fixing holes 321, and the gear shaft 33 passes through the second fixing holes 39a. The aforementioned torque element 34, the gear 35, the first fixed bracket 36, the second fixed bracket 38, and the fixed element 37 are all disposed in the hinge cap 39.

Figure 5:
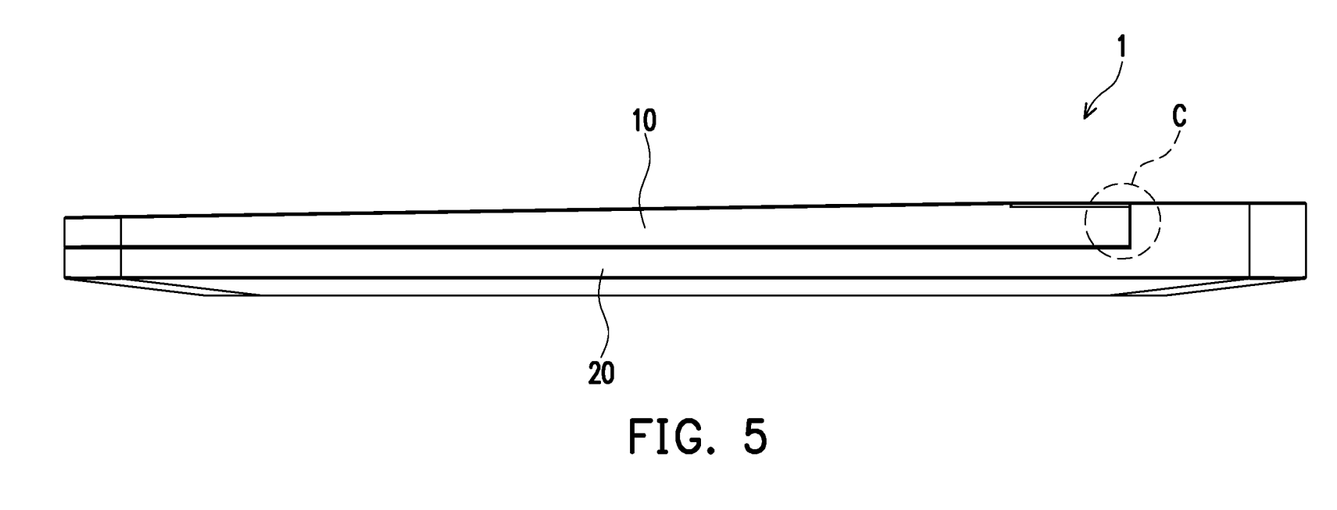
FIG. 5 is a side view of the electronic device in FIG. 1 when it is closed.

FIG. 5 is a side view of the electronic device in FIG. 1 when it is closed. Please refer to FIG. 1, FIG. 2 and FIG. 5 altogether. When the first casing 10 of the electronic device 1 is closed relative to the second casing 20, from the appearance, it is possible to achieve that there is no obvious gap at the joint C between the first casing 10 and the second casing 20 and thus the appearance has integrity. Under the circumstances, the plate portions 311 of the gear bracket 31 are relatively unfolded at 180 degrees; in other words, the plate portions 311 do not overlap with each other in the orthogonal projection interval.

Figure 6A:
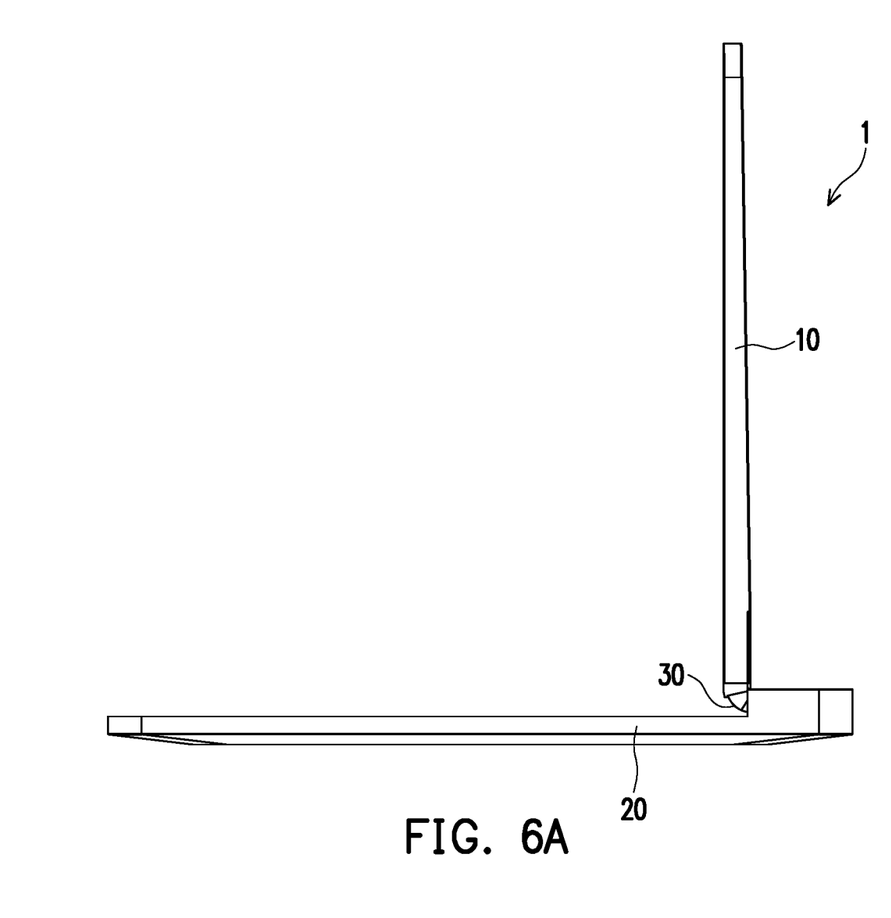
FIG. 6A is a side view of the electronic device of FIG. 1 opened by 90 degrees.
Figure 6B:
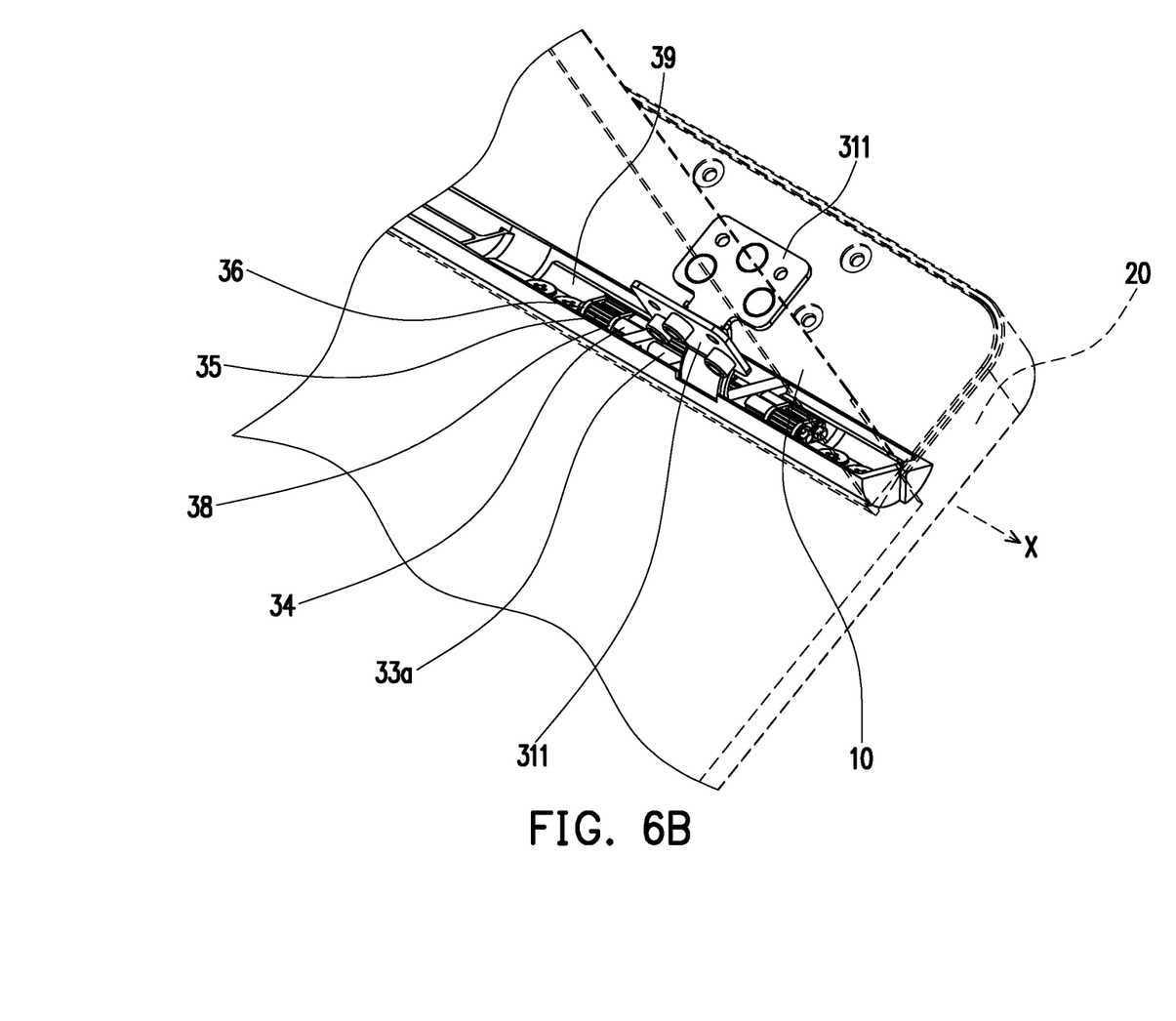
FIG. 6B is a partial schematic view of FIG. 6A.

Through the use of the hinge assembly 30, the first casing 10 can be opened from 0 to 90 degrees relative to the second casing 20, as shown in FIG. 6A and FIG. 6B, where FIG. 6A is a side view of the electronic device 1 of FIG. 1 opened by 90 degrees, and FIG. 6B is a partial schematic view of FIG. 6A.

Figure 7:
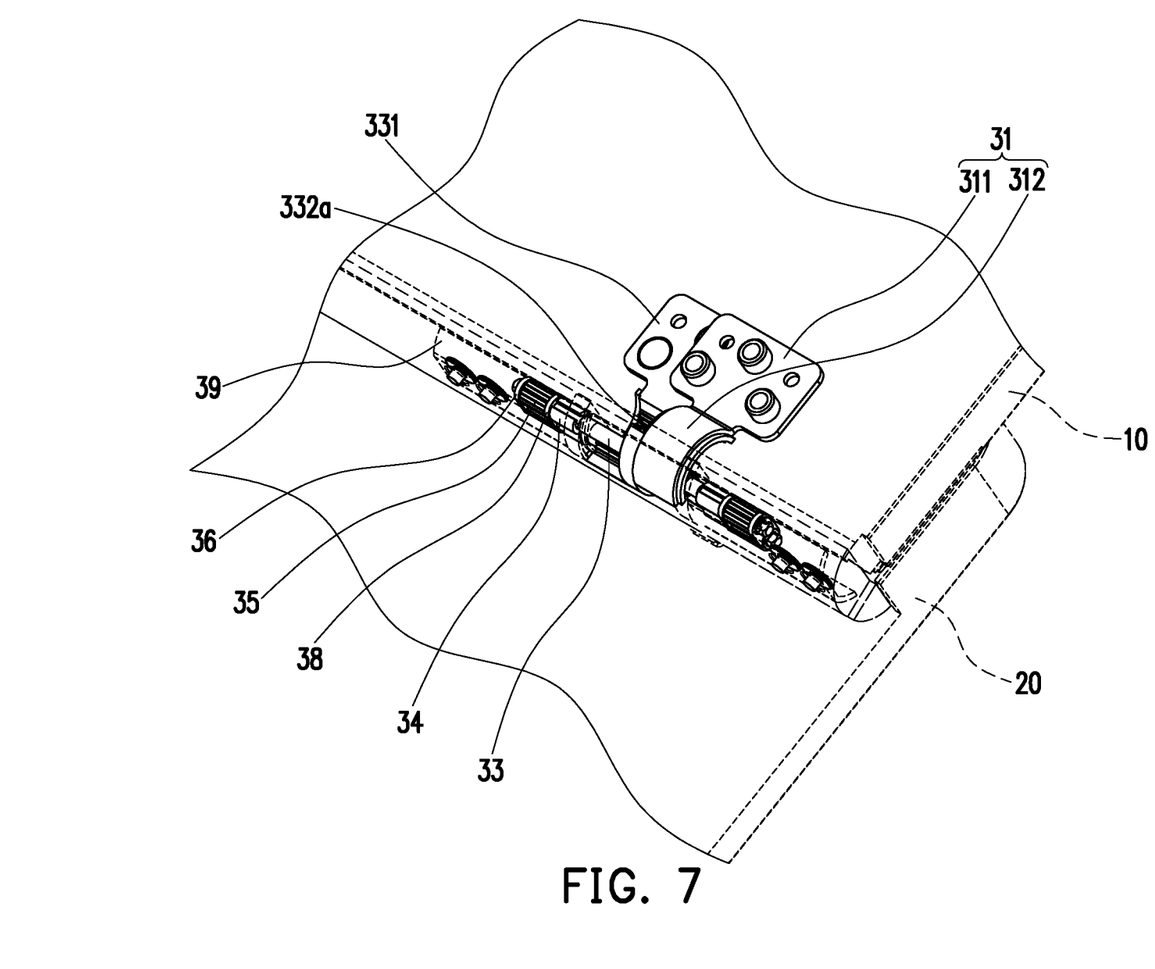
FIG. 7 is a partial schematic view of the electronic device of FIG. 3 when it is opened.

FIG. 7 is a partial schematic view of the electronic device 1 of FIG. 3 when it is opened. Please refer to FIG. 3 and FIG. 7 altogether. The first casing 10 can be opened to 180 degrees relative to the second casing 20, as the state shown in FIG. 3 and FIG. 7, and under the circumstances there is a range where the plate portions 311 of the gear bracket 31 overlap each other in the orthogonal projection interval.

Figure 8A:
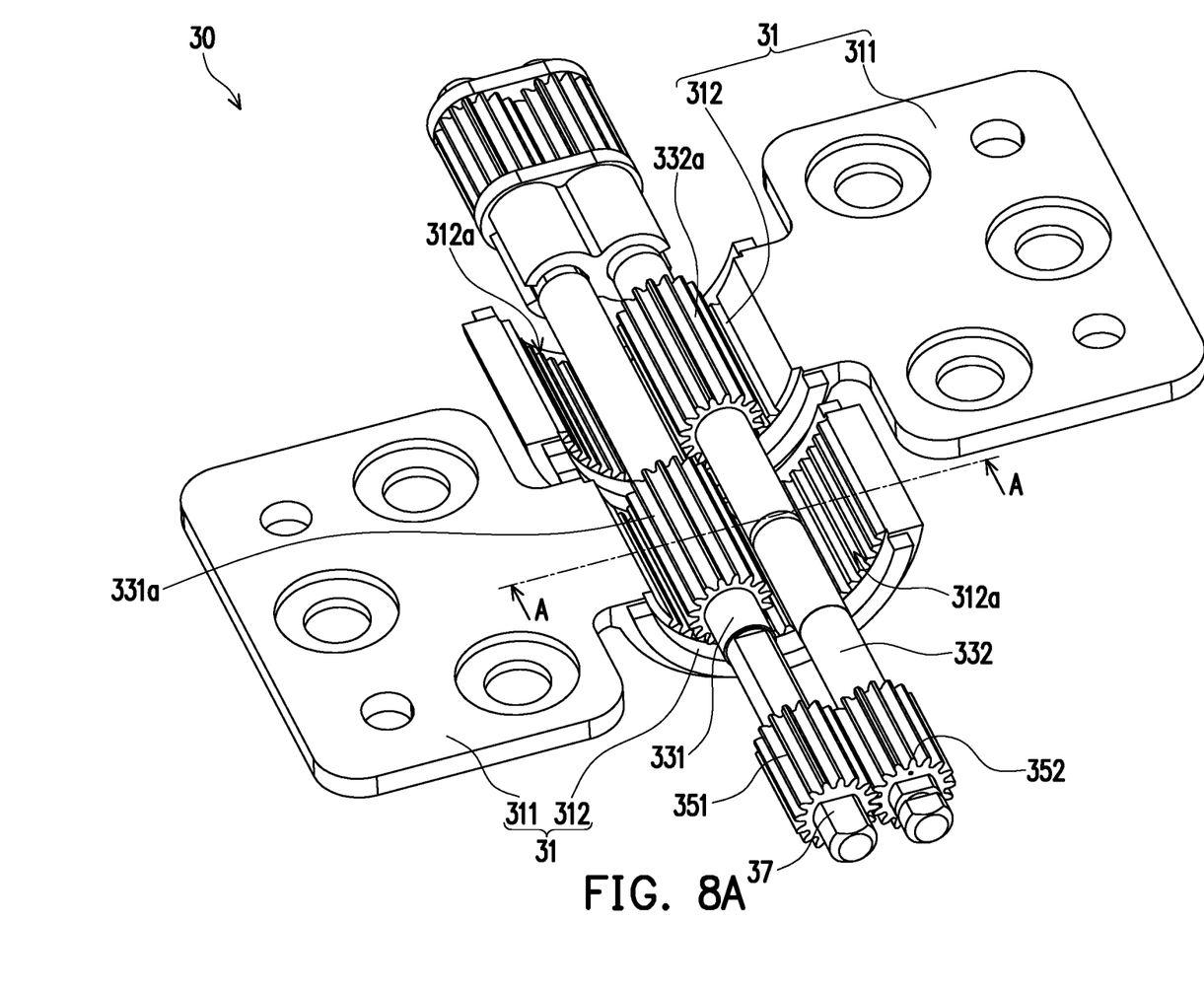
FIG. 8A is a schematic view showing rotation of a hinge assembly.
Figure 8B:
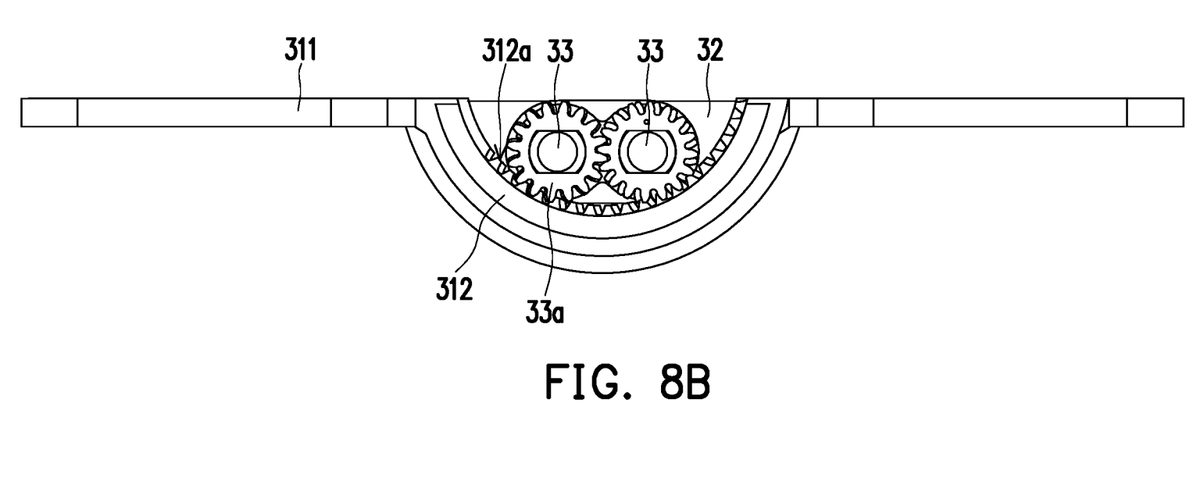
FIG. 8B is a cross-sectional view of the hinge assembly of FIG. 8A taken along the line A-A.

FIG. 8A is a schematic view showing rotation of a hinge assembly 30, and FIG. 8B is a cross-sectional view of the hinge assembly 30 of FIG. 8A taken along the line A-A. Some components are omitted from FIG. 8A to make the diagram to be more comprehensible. Please refer to FIG. 8A and FIG. 8B altogether. When the first casing 10 and the second casing 20 are relatively opened from the closed state, the first casing 10 drives the plate portion 311 of the gear bracket 31 connected thereto to rotate. Under the circumstances, the outer gear of the outer gear portion 331a of the gear shaft 331 is also engaged with the inner gear 312a of the arc portion 312 of the gear bracket 31, so the first casing 10 can rotate relative to the second casing 20.

In the meantime, because the two gears 351 and 352 on the same side of the gear shaft 33 are engaged with each other, with the transmission of force, the outer gear portion 331a and the arc portion 312 are relatively displaced and simultaneously drive the gear 351 to rotate clockwise, then drive the gear 352 engaged with the gear 351 to rotate counterclockwise.

Since the torsion element 34 (shown in FIG. 4) holds the two gear shafts 331 and 332, the rotational force caused by the engagement of the gear 351 and the gear 352 will further drive the outer gear portion 332a of the gear shaft 332 to rotate relative to the arc portion 312 of the corresponding gear bracket 31.

In short, that is, the hinge assembly 30 will drive the first casing 10 and the second casing 20 to rotate simultaneously, instead of a single casing being fixed and the other casing being relatively rotated.

Specifically, the rotation axis of the arc portion 312 is designed to fall outside the outer gear portion 33a, which may be on the first casing 10 (shown in FIG. 2) or the second casing 20 (shown in FIG. 2), and the rotation axis of the arc portion 312 does not fall on any part of the outer gear portion 33a. With such design, the first casing 10 can be opened to 180 degrees relative to the second casing 20.

In summary, the present disclosure provides a hinge assembly with a novel structure. By designing the gear bracket to have a plate portion and an arc portion, and applying it to an electronic device, the rotation axis of the arc portion is designed to fall on the first casing or the second casing, such that the first casing and the second casing can be relatively opened to 180 degrees.

In addition, when the user opens the electronic device, through the cooperation of the outer gear of the outer gear portion of the gear shaft and the inner gear of the arc portion as well as the cooperation of the gear sleeved on the end of the gear shaft, the two casings of the electronic device can move simultaneously.

What is claimed is:

1. A hinge assembly, comprising:
   a pair of gear brackets coaxially staggered from each other in an axial direction, wherein each of the pair of gear brackets has a plate portion and an arc portion, and the arc portions have an inner gear;
   a shaft holder provided between the arc portions of the pair of gear brackets, wherein the shaft holder has a pair of first fixing holes;
   a pair of gear shafts passing through the pair of first fixing holes and fixed to the shaft holder in parallel to the axial direction, wherein each of the gear shafts has an outer gear portion, and the outer gear portion has an outer gear, and the outer gear and the inner gear of the arc portion are engaged with each other;
   a pair of torque elements respectively sleeved on opposite ends of the pair of gear shafts; and
   a plurality of gears sleeved on the ends of the pair of gear shafts in a one-to-one manner, wherein the gears provided on the same side of the pair of gear shafts are engaged with each other.

2. The hinge assembly of claim 1, further comprising a pair of first fixed brackets sleeved on the pair of gear shafts, and wherein the gears are fixed between the torque element and the first fixed brackets.

3. The hinge assembly of claim 2, further comprising a plurality of fixed elements, which are sleeved on the ends of the pair of gear shafts, and are configured to fix the first fixed brackets on the ends of the pair of gear shafts.

4. The hinge assembly of claim 3, wherein the fixed element is an E-ring.

5. The hinge assembly of claim 1, further comprising a pair of second fixed brackets, which are sleeved on the pair of gear shafts, and wherein the second fixed brackets are disposed between the gear and the torque element.

6. The hinge assembly of claim 1, further comprising a pair of hinge caps, and wherein the pair of gear brackets is disposed between the pair of hinge caps.

7. An electronic device, comprising:
   a first casing;
   a second casing;
   a hinge assembly, which is connected between the first casing and the second casing, wherein the hinge assembly comprises:
      a pair of gear brackets coaxially staggered from each other in an axial direction, wherein each of the pair of gear brackets has a plate portion and an arc portion, the plate portion is connected to the first casing or the second casing respectively, and the arc portions have an inner gear;
      a shaft holder provided between the arc portions of the pair of gear brackets, wherein the shaft holder has a pair of first fixing holes;
      a pair of gear shafts passing through the pair of first fixing holes and fixed to the shaft holder in parallel to the axial direction, wherein each of the gear shafts has an outer gear portion, and the outer gear portion has an outer gear, and the outer gear and the inner gear of the arc portion are engaged with each other;
      a pair of torque elements respectively sleeved on opposite ends of the pair of gear shafts; and
      a plurality of gears sleeved on the ends of the pair of gear shafts in a one-to-one manner, wherein the gears provided on the same side of the pair of gear shafts are engaged with each other.

8. The electronic device of claim 7, further comprising a pair of first fixed brackets sleeved on the pair of gear shafts, and wherein the gears are fixed between the torque element and the first fixed brackets.

9. The electronic device of claim 8, further comprising a plurality of fixed elements, which are sleeved on the ends of the pair of gear shafts, and are configured to fix the first fixed brackets on the ends of the pair of gear shafts.

10. The electronic device of claim 9, wherein the fixed element is an E-ring.

11. The electronic device of claim 7, further comprising a pair of second fixed brackets, which are sleeved on the pair of gear shafts, and wherein the second fixed brackets are disposed between the gear and the torque element.

12. The electronic device of claim 7, further comprising a pair of hinge caps, and wherein the pair of gear brackets is disposed between the pair of hinge caps.

* * * * *